United States Patent
Hirai et al.

(10) Patent No.: US 7,752,001 B2
(45) Date of Patent: Jul. 6, 2010

(54) METHOD OF CORRECTING COORDINATES, AND DEFECT REVIEW APPARATUS

(75) Inventors: Takehiro Hirai, Ushiku (JP); Kazuo Aoki, Hitachinaka (JP); Kumi Kaneko, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 301 days.

(21) Appl. No.: 11/753,966

(22) Filed: May 25, 2007

(65) Prior Publication Data
US 2007/0276620 A1    Nov. 29, 2007

(30) Foreign Application Priority Data
May 26, 2006    (JP)    .............................. 2006-146042

(51) Int. Cl.
*G01C 17/38* (2006.01)
*G21C 17/00* (2006.01)

(52) U.S. Cl. .................. 702/95; 702/182; 700/110; 382/149

(58) Field of Classification Search ......... 700/108–110, 700/121; 702/81, 83, 85, 94, 95, 182–185; 382/145, 149
See application file for complete search history.

(56) References Cited

U.S. PATENT DOCUMENTS

| | | |
|---|---|---|
| 6,713,761 B2 | 3/2004 | Nakada et al. |
| 6,897,445 B2 | 5/2005 | Nakada et al. |
| 7,009,178 B2 | 3/2006 | Nakada et al. |

FOREIGN PATENT DOCUMENTS

| | | | |
|---|---|---|---|
| JP | 2000215839 | * | 8/2000 |
| JP | 2001-338601 A | | 12/2001 |

OTHER PUBLICATIONS

Machine translation of JP 2000215839, Aug. 2000, Japan; Ono, Katshuiro.*

* cited by examiner

*Primary Examiner*—Charles R Kasenge
(74) *Attorney, Agent, or Firm*—Crowell & Moring LLP (57) ABSTRACT

The present invention provides a method of correcting coordinates so as to quickly and properly arrange a sample in a field of view in a review apparatus for moving a sample stage onto the specified coordinates to review the sample. A review apparatus according to the present invention, which is a review apparatus for moving a sample stage onto coordinates previously calculated by a checking apparatus to review the sample, has a function of retaining a plurality of coordinate correction tables to correct a deviation between a coordinate value previously calculated by a checking apparatus and an actual sample position detected by the review apparatus. The review apparatus evaluates correction accuracy of the plurality of coordinate correction tables and applies one of the coordinate correction tables with the maximum evaluation value.

8 Claims, 7 Drawing Sheets

CHECK MODE 1      CHECK MODE 2

| ID | CHECKED COORDINATES | CORRECTED COORDINATES 1 | CORRECTED COORDINATES 2 | DETECTED COORDINATES | EVALUATION VALUES | |
|---|---|---|---|---|---|---|
| | $(x_0, y_0)$ | $(x_1, y_1)$ | $(x_2, y_2)$ | $(x, y)$ | $E_1$ | $E_2$ |
| 1 | (5, 16) | (4, 18) | (6, 14) | (4, 17) | 1.0 | 0.3 |
| 2 | (7, 16) | (6, 18) | (8, 14) | (6, 17) | 1.0 | 0.3 |
| 3 | (8, 14) | (7, 16) | (9, 12) | (7, 15) | 1.0 | 0.3 |
| 4 | (13, 12) | (12, 14) | (14, 10) | (13, 13) | 0.8 | 0.3 |
| 5 | (16, 6) | (15, 8) | (17, 4) | (17, 5) | 0.4 | 0.5 |
| 6 | (15, 5) | (14, 7) | (16, 3) | (16, 4) | 0.3 | 1.0 |
| 7 | (10, 2) | (9, 4) | (11, 0) | (10, 1) | 0.3 | 0.8 |

METHOD OF CORRECTING COORDINATES, AND DEFECT REVIEW APPARATUS

BACKGROUND OF THE INVENTION

1. Field of the Invention

The present invention relates to a method and apparatus for correcting coordinates so as to arrange a sample in a field of view in a review apparatus for moving a sample stage onto the specified coordinates to review the sample. More particularly, the present invention relates to an apparatus for deciding a position for review based on information of a position of a defect detected by a higher-level checking apparatus like an SEM (Scanning Electron Microscope) based defect review apparatus.

2. Background Art

In semiconductor manufacturing, it is important to find defects appearing during a manufacturing process in early phases and take measures against the defects in order to ensure yield enhancement. In recent years, even slight defects have nonnegligible effects on yields as semiconductors become smaller, hence making the size of defects to be reviewed smaller.

An SEM-based defect review apparatus is an apparatus for reviewing such slight defects. The apparatus generally reviews defects based on positions of the defects detected by an optical checking apparatus. In this way, before the SEM-based defect review apparatus reviews in detail the defects detected by the checking apparatus, the checking apparatus executes the defect detecting processing as preprocessing. So the detecting apparatus is herein defined as a "higher-level" apparatus.

A defect is reviewed manually using the SEM-based defect review apparatus as follows: a sample stage is moved onto coordinates outputted by the higher-level checking apparatus for image pickup at a low magnification (in a wide field of view); after a position of the defect is confirmed visually, the sample stage is moved such that the defect position is in the middle of the field of view; and a defective image is picked up at a high magnification (in a small field of view). These steps have been automated as the ADR (Automatic Defect Review). In the ADR, a defect appearing in a field of view of an image at a low magnification is detected using image processing, and then a sample stage is moved such that the detected defect is in the middle of the field of view to pick up a high magnification image at a relevant magnification for review of details of the defect. From the perspective of the image processing, a low magnification image is preferably magnified to fully magnify the defect for the review. However, a too high magnification may cause the defect to be out of the view field if a deviation of the position is substantial. Because of this, ADR configuration has a difficulty in setting a parameter of a magnification for a low magnification image, so that user experience is needed for the setting. This is not preferable since the ADR steps depend on user's skill based on the user experience.

To address the above problem, JP Patent Publication (Kokai) No. 2001-338601 (2001) proposes a method of efficiently performing a task of setting a magnification for a low magnification image including: a function of visualizing a deviation between a defect position outputted by a higher-level checking apparatus and a defect position detected in the ADR by displaying the deviation as a vector on a wafer map; a function of correcting a coordinate system such that the deviation is minimum; and a function of optimizing the magnification for the low magnification image depending on the amount of the detected deviation. These functions can visualize a deviation, optimize a correction table, and optimize a magnification for a low magnification image.

However, if there are a plurality of higher-level checking apparatuses, or if different deviation tendencies are shown depending on, for example, check conditions or a deviation tendency changes over time even in the case of that there is only a single checking apparatus, the optimal correction result cannot be obtained using a single correction table.

SUMMARY OF THE INVENTION

In view of the foregoing, an object of the present invention is to provide a method and an apparatus for correcting coordinates so as to arrange a sample in a field of view properly and quickly in a review apparatus for moving a sample stage onto the specified coordinates to review the sample.

To solve the above problems, the present invention is mainly characterized in that a plurality of coordinate correction tables are retained, correction effectiveness of the coordinate correction tables in review is evaluated, and the review is performed using an optimal correction table.

More specifically, the present invention relates to a review apparatus for moving a sample stage onto coordinates (a defect position on a wafer), for example, previously calculated by a checking apparatus so as to review the sample. The review apparatus according to the present invention identifies a combination of the checking apparatus calculating a coordinate value and a condition (for example, a check mode) to calculate the coordinates. Based on the identified combination of said apparatus and said calculation condition, one of a plurality of coordinate correction tables is selected that are provided in correspondence to the combination of said checking apparatus and the calculation condition of said coordinates. Then, the coordinates calculated by said checking apparatus are corrected according to said selected coordinate correction tables. In this way, an optimal correction result can be obtained quickly and properly compared to the conventional case that correction table switching depends on a checking apparatus ID.

Furthermore, the present invention relates to a review apparatus for moving a sample stage onto coordinates (a defect position on a wafer), for example, previously calculated by a checking apparatus so as to review the sample, including: a plurality of coordinate correction tables to correct a deviation between a pre-calculated coordinate value and a sample position on said review apparatus; and coordinate correction table evaluation means for evaluating accuracy of the correction according to said plurality of coordinate correction tables. Based on the result of the evaluation by said table evaluation means, one of said plurality of coordinate tables is chosen for use to correct said pre-calculated coordinate value. In this way, even when the coordinate correction table selected based on the combination of the checking apparatus ID and the check mode is no longer optimal due to change over time, a more suitable table can be used to correct the above amount of deviation.

Other features of the present invention will become apparent in the following best embodiment and the attached drawings to practice the present invention.

According to the present invention, an optimal coordinate correction table can be automatically selected for use from a plurality of coordinate correction tables. This can reduce phenomena in that a reviewed object is out of a field of view because a coordinate correction table is not a proper one. Further, using an optimal correction table, the amount of a deviation can be reduced and a review magnification to identify a defect position can be increased. This makes possible to improve defect detection performance by increasing a low magnification (a magnification to detect a defect position) particularly in the ADR.

BRIEF DESCRIPTION OF THE DRAWINGS

FIGS. 3A and 3B are diagrams illustrating different tendencies of deviations depending on check modes.

DETAILED DESCRIPTION OF THE PREFERRED EMBODIMENTS

Referring to the attached drawings, embodiments of the present invention will be described below. A review apparatus according to a first embodiment prepares a plurality of coordinate correction tables to switch to one of the coordinate correction tables statically depending on a checking apparatus and its check mode. On the other hand, a review apparatus according to a second embodiment prepares a plurality of coordinate correction tables to always switch dynamically to one of the coordinate correction tables evaluated as an optimal one by performing the evaluation in parallel to the review, thereby obtaining a better correction result.

First Embodiment

Figure 1:
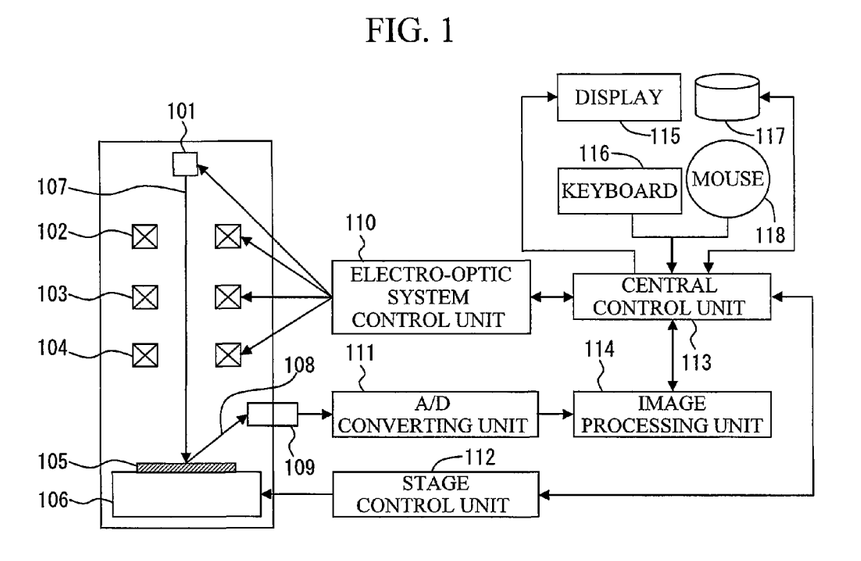
FIG. 1 is a cross-sectional view of basic configuration of an SEM-based semiconductor defect review apparatus.

FIG. 1 is a cross-sectional view of configuration of an SEM-based semiconductor defect review apparatus (a review apparatus) according to an embodiment of the present invention. The SEM-based defect review apparatus in FIG. 1 consists of an electron gun 101, a lens 102, a deflector 103, an objective lens 104, a sample 105, a stage 106, a secondary particle detector 109, an electro-optic system control unit 110, an A/D converting unit 111, a stage control unit 112, a central control unit 113, an image processing unit 114, a display 115, a keyboard 116, a storage device 117, a mouse 118 and the like.

An electron beam 107 emitted by the electron gun 101 converges on the lens 102, is deflected on the deflector 103, converges on the objective lens 104 and then is radiated onto the sample 105. Secondary particles 108 such as secondary electrons or reflected electrons are generated from the sample 105 radiated with the electron beam 107 depending on a form or materials of the sample. The generated secondary particles 108 are detected by the secondary particle detector 109 and converted into digital signals by the A/D converting unit 111 to form an SEM image. The produced SEM image is subjected to image processing such as defect detection executed by the image processing unit 114. The lens 102, the deflector 103 and the objective lens 104 are controlled by the electro-optic system control unit 110. A sample is positioned on the stage 106 controlled by the stage control unit 112. The central control unit 113 interprets an input from the keyboard 116, the mouse 118 or the storage device 117 to control the electro-optic system control unit 110, the stage control unit 112, the image processing unit 114 and the like, and outputs details of the processing on the display 115 and to the storage device 117 as necessary. The storage device 117 stores coordinate correction tables and a control program illustrated in flowcharts in FIGS. 4 and 6 as described below.

Figure 2:
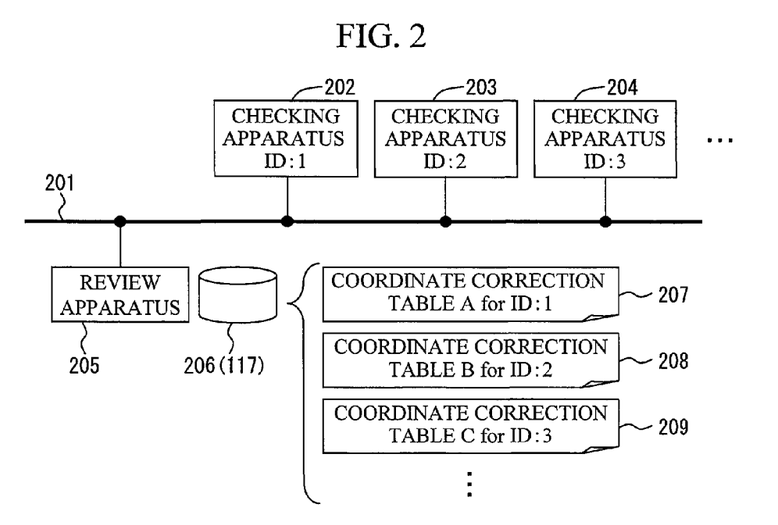
FIG. 2 is a diagram of network connection between checking apparatuses and a review apparatus.

FIG. 2 is a diagram of network connection between higher-level checking apparatuses and a review apparatus according to the embodiment of the present invention. A network (201) connects to a checking apparatus (ID: 1) (202), a checking apparatus (ID: 2) (203), a checking apparatus (ID: 3) (204) and a review apparatus (205). The network 201 can also connects to a plurality of review apparatuses. A review apparatus connects to a storage device (206). The storage device can be integrated into the review apparatus or separated from the review apparatus for the network connection. The storage device saves coordinate correction tables (207, 208 and 209) corresponding to the checking apparatuses. The storage device switches to an optimal coordinate correction table based on an ID of a checking apparatus when the review is executed. In FIG. 2, the coordinate correction tables correspond to the checking apparatuses one-to-one. For example, a coordinate correction table A is selected when the checking apparatus (ID: 1) is used to detect a defect, a coordinate correction table B is selected when the checking apparatus (ID: 2) is used to detect a defect, and a coordinate correction table C is selected when the checking apparatus (ID: 3) is used to detect a defect. Since the checking apparatuses correspond to the coordinate correction tables one-to-one as described in the above, one of the checking apparatuses sends information of a defect position and a checking apparatus ID to at least a review apparatus, and the review apparatus selects a coordinate correction table corresponding to the checking apparatus ID.

Figure 3A:
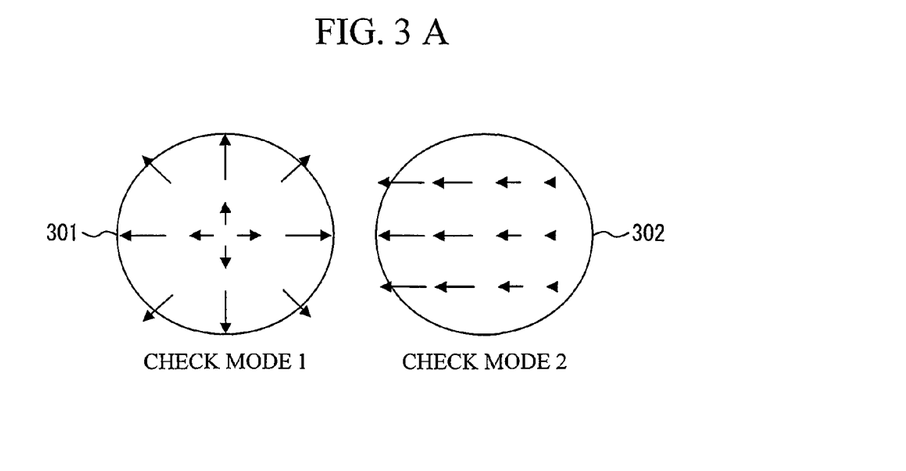
FIG. 3A shows an instance of vector display for the deviation tendencies.
Figure 3B:
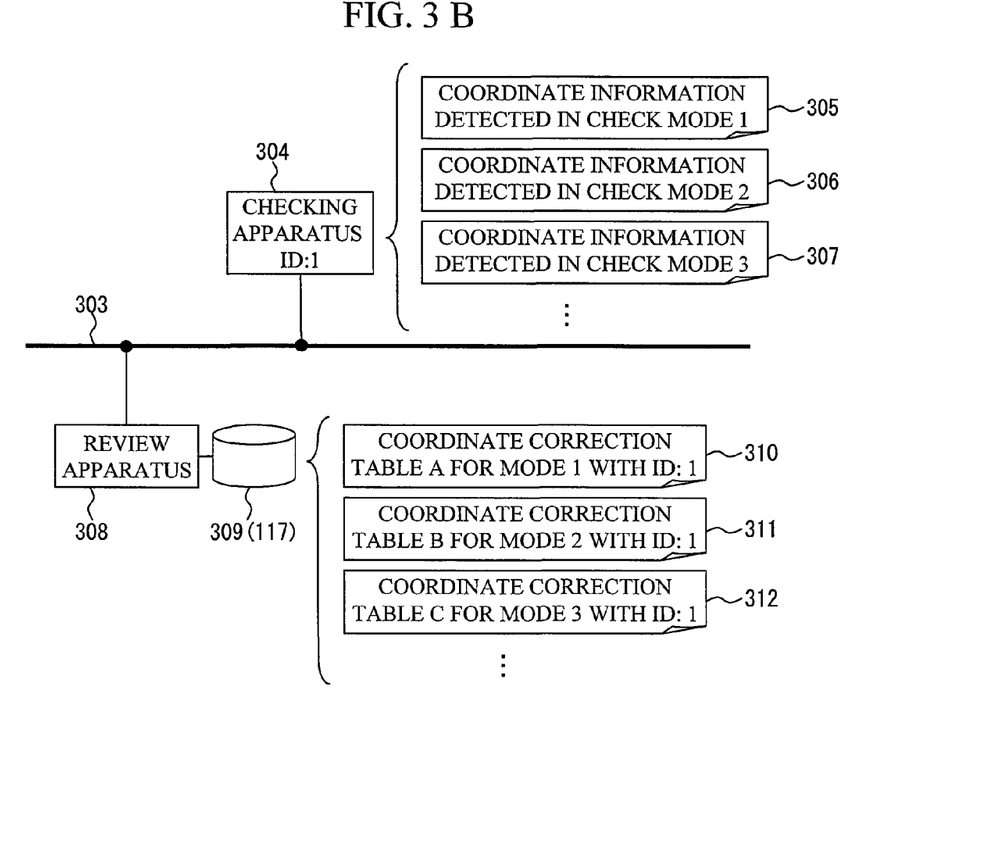
FIG. 3B is a diagram of the network connection between checking apparatuses and a review apparatus.

FIG. 3 is a drawing illustrating processing in the case of different tendencies of deviations of detected coordinates depending on check modes of higher-level checking apparatuses. Hereinafter, a check mode means a manner to detect a defect including, for example, a mode to detect a defect by exposing light onto a wafer at an angle, a mode to detect a defect by looking a wafer from the above and the like (such as a mode to detect a defect by scanning a wafer on XY coordinates or a mode to detect a defect by scanning a wafer on rotating coordinates). FIG. 3A is one example of display of differences between coordinate values detected by the higher-level checking apparatus and coordinate values detected by the review apparatus using vectors (also disclosed in JP Patent Publication (Kokai) No. 2001-338601 (2001)). FIG. 3A shows that, for example, when a position is farther apart from the center of the wafer, the deviation tends to be larger toward the wafer periphery in a check mode 1 (301), while a deviation toward the left tends to be larger in the left side of the wafer in a check mode 2 (302). In such instances, when the coordinate correction table switching depends on only an ID of a checking apparatus, it is difficult to obtain good correction results in both of the check modes because of different tendencies of deviations on coordinates depending on check modes.

In view of the above difficulty, this embodiment has a function of switching to a coordinate correction table depending on a check mode of the checking apparatus in addition to the function of switching to a coordinate correction table based on a checking apparatus ID. Although an instance of different deviation tendencies depending on check modes is assumed herein, the different deviation tendencies depending on check modes may be due to a defect position identify algorithm of a checking apparatus or operation of a sample stage of the checking apparatus. Furthermore, the accuracy may decrease in detecting a defect position by a checking apparatus over time, so that the apparatus generally needs to be maintained regularly.

FIG. 3B illustrates a function of switching to a correction table depending on a check mode (a condition for a checking apparatus to detect a defect and calculate coordinates of the defect). A checking apparatus (304) and a review apparatus (308) connect to a network 303. The review apparatus connects to a storage device (309). The storage device can be integrated into the review apparatus or separated from the review apparatus for the network connection. The checking apparatus 304 sends coordinates of a detected defect and information of a check mode together to the review apparatus. The information of a check mode includes, for example: information of a mode to detect a defect by exposing light onto a wafer at an angle, a mode to detect a defect by looking a wafer from the above and the like (such as a mode to detect a defect by scanning a wafer on XY coordinates or a mode to detect a defect by scanning a wafer on rotating coordinates) as described in the above; information of sensitivity of the checking apparatus in the detection; information of a serial number of the detecting apparatus and the like.

The review apparatus 308 receives the information of a check mode from the checking apparatus 304 and determines a check mode of the checking apparatus from the information. Then, the review apparatus 308 switches to one of the coordinate correction tables (310, 311 and 312) based on the determined check mode. The coordinate correction tables are configured to perform coordinates correction optimally for any of the check modes. For example, the tables are used to obtain a deviation between coordinates actually detected in a check mode of the checking apparatus and coordinates detected by the review apparatus by a statistically process.

As described in the above, the correction table switching depends on a pre-determined check mode of a pre-determined checking apparatus, enabling to obtain a good correction result in an instance with different deviation tendencies depending on the check modes.

Second Embodiment

As described above, the review apparatus according to the first embodiment selects a coordinate correction table statically in correspondence to a check mode of the checking apparatus. That is, a checking apparatus and a check mode uniquely decide a coordinate correction table.

However, because of temporal changes or the like in the apparatus, a coordinate correction table decided uniquely depending on a check mode is not always an optimal table. Although periodical maintenance is effective to the temporal changes as described above, its steps must be extremely complicated.

To address the above problem, according to a second embodiment, even if a checking apparatus and/or a review apparatus change with a certain tendency over time, a plurality of coordinate correction tables are prepared in correspondence to the temporal changes, or a plurality of coordinate correction tables are prepared in correspondence only to a plurality of check modes to always switch dynamically to a coordinate correction table evaluated as an optimal one by performing the evaluation in parallel to the review, thereby obtaining a better correction result.

The system configuration (FIG. 2) and the configuration of the review apparatus (FIG. 3) are similar to those of the first embodiment, and therefore will not be further described herein.

Figure 4:
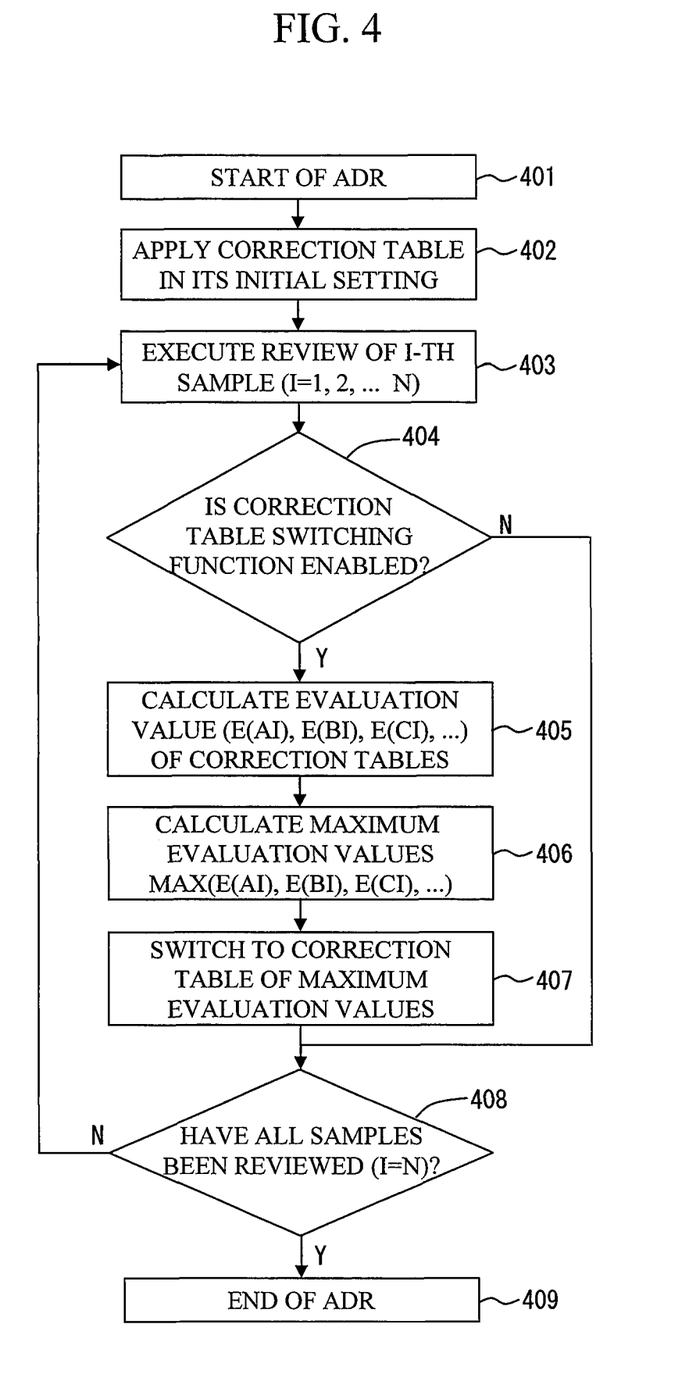
FIG. 4 is a flow diagram of a function of automatically switching to a coordinate correction table.

FIG. 4 is a flowchart illustrating a function of automatically switching to a coordinate correction table. This function is operated by the central control unit 113 unless otherwise noted. The coordinate correction table switching is automatic herein although a user can set for the coordinate correction table switching. That is, this embodiment is characterized in that a deviation tendency is evaluated based on a coordinate value outputted by a checking apparatus and a coordinate value of a sample position detected in the review to switch to an optimal coordinate correction table in the review.

In FIG. 4, at the start of the review (401), a coordinate correction table in its initial setting is in use (402). The coordinate correction table in its initial setting can be configured as any table, or configured based on a previous processing result as described below (see FIG. 6).

During the review (403 to 409), if the coordinate correction table selecting function is enabled (the function is ON) (404), evaluation values of the coordinate correction tables are calculated (405), a maximum evaluation value is further calculated (406), and a coordinate correction table with the maximum evaluation value is selected (407). These processes allow for review using an optimal coordinate correction table even if a tendency differs from a default coordinate correction table.

An equation (1) is an exemplary formula of calculating an evaluation value E of a coordinate correction table. The evaluation value is defined so as to be higher for a smaller deviation amount D after the correction by a coordinate correction table. Generally, a review order is often decided such that the amount of stage movement is minimum to improve throughput. In that case, samples will be reviewed from the closest sample in order.

[Formula 1]

$$E_n = \frac{1}{\sum_{i=1}^{n} W_i D_i} \tag{1}$$

Since deviation tendencies are local in most cases, close samples often have similar deviation tendencies. A value is effective that is evaluated by weighting the tendency of the closest deviation in the case of a review order with the minimum distance of a movement. In that case, an increasing function of a weighting coefficient W for the review order is effective. For example, it is effectual to ignore the deviation amount previous to closer points. Alternatively, in the case of a sufficient calculation cost including a processing time, the weighting function can be effectually a function of a distance between a review point to calculate an evaluation value and a review point with the previously calculated deviation amount.

Figure 5:
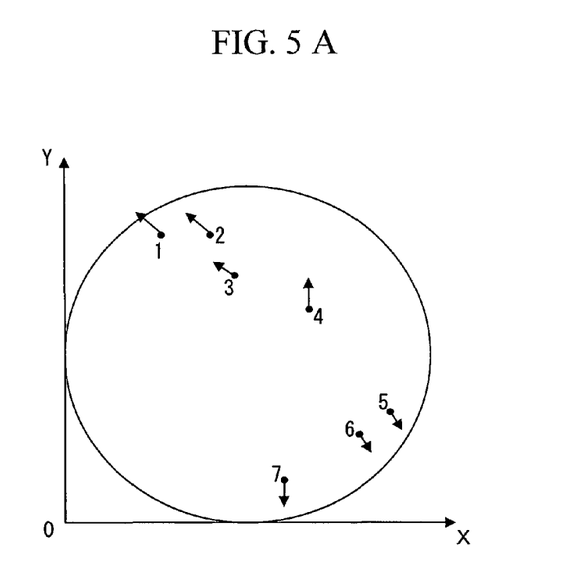
FIG. 5 shows an example of switching to a coordinate correction table with considering weight coefficients.

FIG. 5 shows one example of switching to a coordinate correction table with considering the weight coefficient described in the above. In FIG. 5A, there are seven review points on a wafer. A point on the wafer indicates checked coordinates $(x_0, y_0)$ outputted by a checking apparatus, and also indicates detected coordinates $(x, y)$ detected by the review apparatus as shown by the head of the arrow. Two coordinate correction tables are evaluated herein and coordinates corrected according to the tables are correction coordinates 1 $(x_1, y_1)$ and correction coordinates 2 $(x_2, y_2)$. For simplicity, a correcting equation for the correction tables are simplified to calculate the correction coordinates 1 by the equation (2) and the correction coordinates 2 by the equation (3):

[Formula 2]

$$(x_1, y_1) = (x_0 - 1, y_0 + 2) \quad (2)$$

[Formula 3]

$$(x_2, y_2) = (x_0 + 1, y_0 - 2) \quad (3)$$

Set the weight coefficient W to be ½ for two previous points and ignore deviation tendencies of points previous to the two points to get the equation (4):

[Formula 4]

$$W_i = \begin{cases} 1 & (i = 1) \\ 1/2 & (i \geq 2 \text{ and } i = n, n-1) \\ 0 & (i \geq 3 \text{ and } i \leq n-2) \end{cases} \quad (4)$$

The evaluation value E of a correction table is calculated using the following equation (5) based on the equations (1) and (4):

[Formula 5]

$$E_i = \begin{cases} \dfrac{1}{D_i} & (i = 1) \\ \dfrac{2}{D_i + D_{i-1}} & (i \geq 2) \end{cases} \quad (5)$$

where $D_0 = 0$.

FIG. 5B shows coordinates checked by the checking apparatus and the review apparatus, corrected coordinates calculated using the equations (2) and (3), and specific numerical value examples of evaluation values calculated using the equation (5). Setting a table 1 (equation (2)) as an initial correction table, the review is executed using the correction table 1 from the first point through the fifth point inclusive, and a correction table 2 will be used after the fifth point where an evaluation value of the table 2 exceeds that of the table 1.

Figure 6:
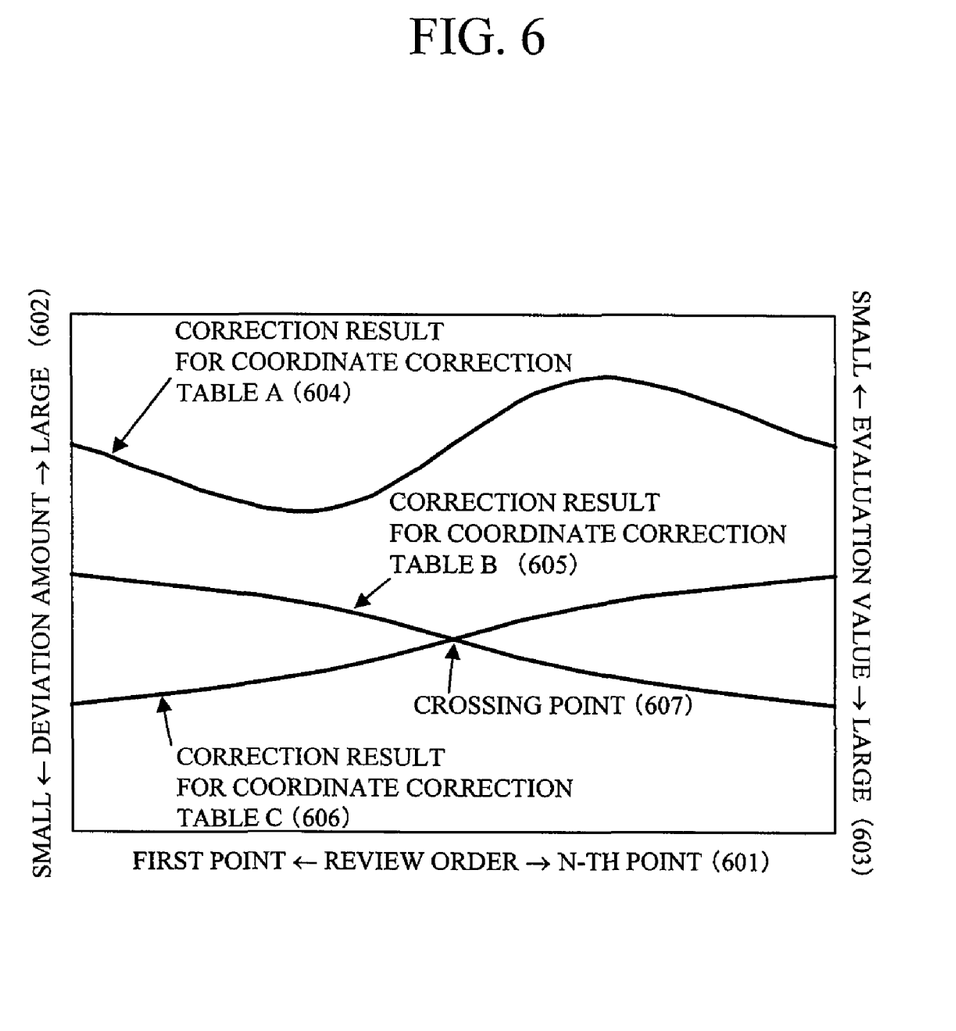
FIG. 6 is a graph of a result according to the correcting coordinate correction tables.

Referring to FIG. 6, the switching to a table will be described more conceptually. FIG. 6 is an exemplary graph representing a correction result using coordinate correction tables A (604), B (605) and C (606) with a review order (601) on the abscissa axis and deviation amounts (602) on the ordinate axis. Inverse numbers of evaluation values (603) instead of the deviation amounts (602) on the ordinate axis can also yield the same graph tendency. If the coordinate correction table A (604) is selected as an initial table, the coordinate correction table C (606) is used after the second point according to an evaluation result at the first point. Further, the coordinate correction table B (605) is selected after a crossing point (607) according to an evaluation result at the crossing point (607). Similarly, If the coordinate correction table C (606) is selected as the initial table, the coordinate correction table C (606) continues to be used till the crossing point (607); the coordinate correction table B (605) is used after the crossing point (607) according to an evaluation result at the crossing point (607). Further, if the coordinate correction table C (606) is selected as the initial table, the coordinate correction table C (606) continues to be used after the second point according to an evaluation result at the first point, and the coordinate correction table B (605) is used after the next point to the crossing point (607) according to an evaluation result at the crossing point (607). In this way, an optimal correction table is used during the review to allow search for a defect with the minimum deviation amount. In addition, the computational complexity of the comparison and evaluation processing on the coordinate correction tables is so small that the processing can be executed without reducing ADR throughput.

Figure 7:
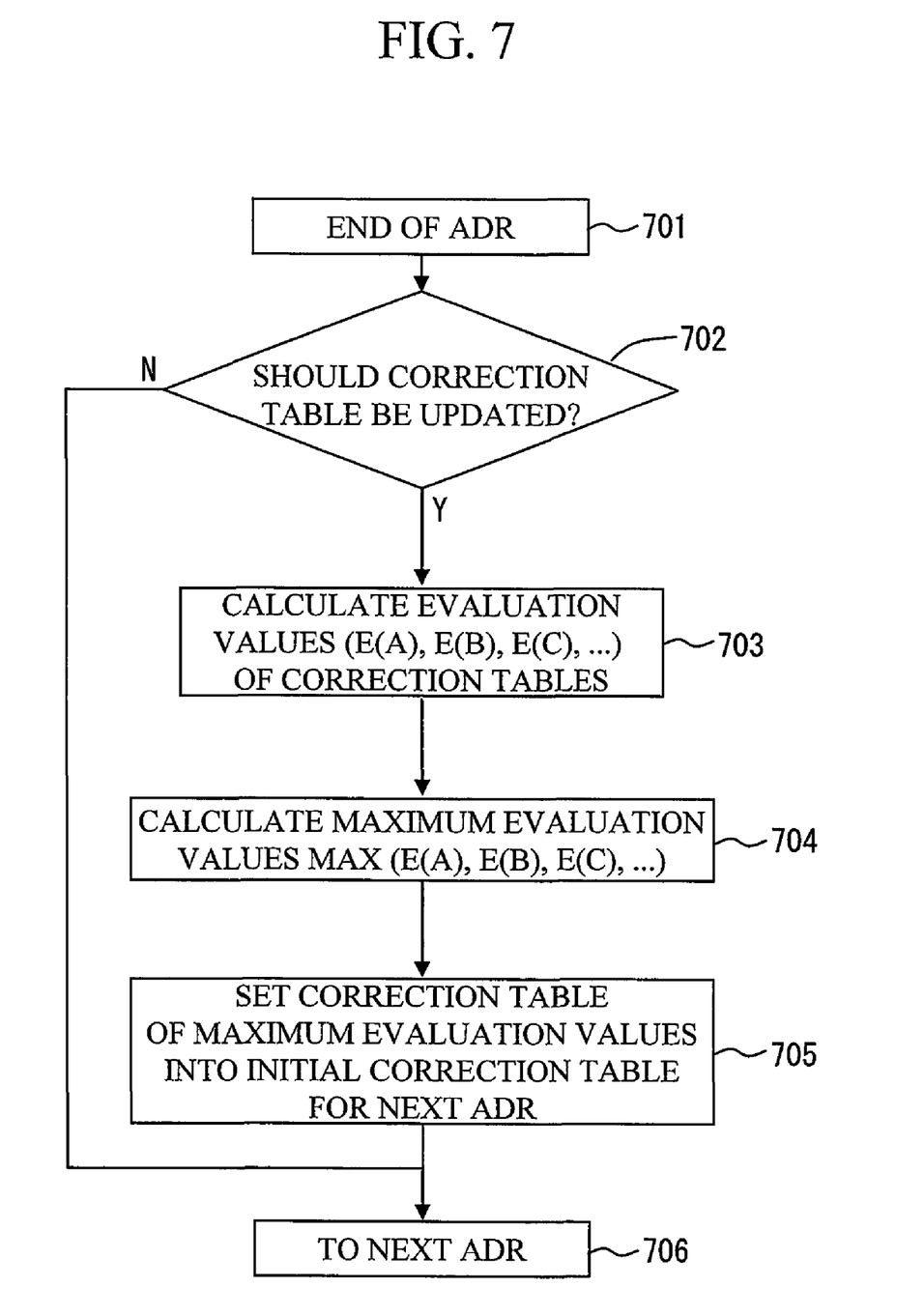
FIG. 7 is a flow diagram of a function of automatically updating the correction tables.

FIG. 7 is a flowchart illustrating a function of automatically updating the correction tables. This function is operated by the central control unit 113 unless otherwise noted.

In FIG. 7, at the end of the ADR (701), if an automatic update function for the coordinate correction tables is enabled (702), evaluation values of the coordinate correction tables to be compared are calculated (703). Next, a coordinate correction table with the maximum evaluation value among the coordinate correction tables are calculated (704), and then the table is set as an initial coordinate correction table for ADR (705). The coordinate correction tables for the comparison can be newly created coordinate correction tables to be added based on a tendency of deviation measured in previous ADR, or coordinate correction tables to be added that are updated by adding measurement data to the existing coordinate correction tables. The coordinate correction and the creation of the coordinate correction tables can be performed as described in JP Patent Publication (Kokai) No. 2001-338601 (2001), or otherwise. The equation 6 is an exemplary calculating formula of an evaluation value to automatically update the coordinate correction tables. As opposed to the equation 1, the weight coefficient W reflecting a sample position is fixed (W=1).

[Formula 6]

$$E_n = \dfrac{1}{\sum\limits_{i=1}^{n} D_i} \quad (6)$$

Figure 8:
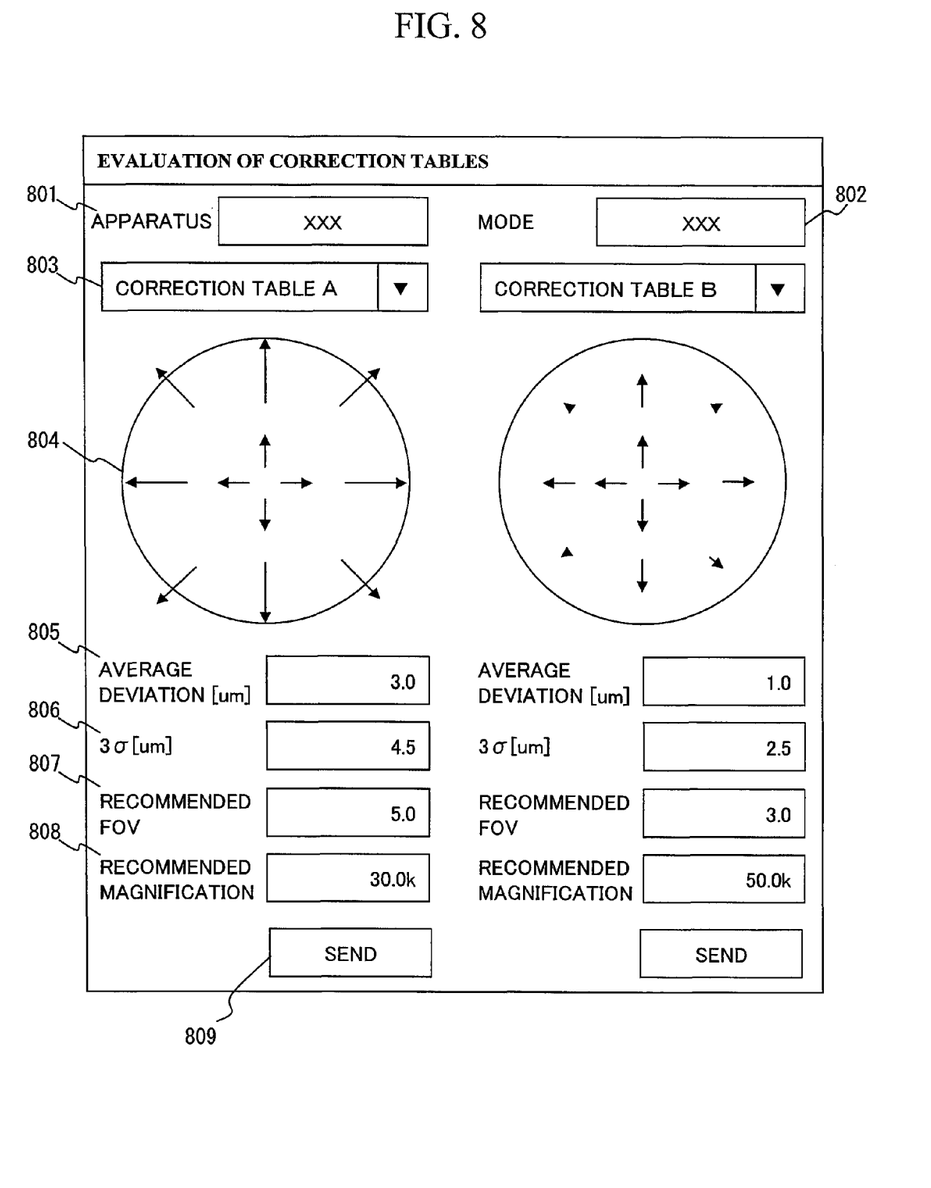
FIG. 8 shows a display screen of a result of evaluation of a correction table.

FIG. 8 is an exemplary display screen for an evaluation result of coordinate correction tables. A name or ID of a checking apparatus to be evaluated is displayed in a box 801 and a check condition is displayed in a box 802. Coordinate correction tables to be evaluated can be selected in boxes 803, while deviation tendencies are displayed as vectors in circles 804 on a wafer map. Average values of deviation amounts are displayed in boxes 805, while values 3σ (triple of variance) (statistically, most information is included within a range of 3σ) are displayed in boxes 806. Values FOV (Field of View) representing sizes of recommended fields of view obtained from the values 3σ are displayed in boxes 807. Further, recommended magnifications corresponding to the recommended FOV are displayed in boxes 808.

To notify a checking apparatus of the information as described above, one of send buttons 809 is pushed. A sending function is preferably automatic sending, but a user can push the send button 809 to notify the checking apparatus when the user desires to notify. In the automatic sending, the sending is performed only if a condition is satisfied, for example, a deviation is over a certain value or difference from a previous deviation is more than a certain value. Such automatic sending can be used to determine whether or not the checking apparatus needs maintenance. Although direct notification to a checking apparatus calculating coordinates is described herein as an example, notification to a system managing the checking apparatus has similar effect.

As described hereinabove, in the review apparatus according to the second embodiment, the coordinate correction table switching is dynamic in correspondence to the change, thereby obtaining a good correction result even if a desired correction result cannot be obtained using a coordinate correction table initially selected depending on, for example, temporal changes in a checking apparatus or a review apparatus.

Further, a coordinate correction table is automatically updated in the second embodiment, thereby allowing to use an optimal correction table and obtain a good correction result after the start of the coordinates correction processing.

Furthermore, in the second embodiment, the amount of a deviation of a defect detected positions between a checking apparatus and a review apparatus is notified to the checking apparatus. If the deviation amount is too large, an administrator can maintain the checking apparatus.

Meanwhile, the present invention can also be embodied in a software program code for realizing the functions of the embodiments. In that case, a system or an apparatus is provided with storage media recording the program code, and the program code is read out so that stores a computer (or CPU, MPU) for the system or the apparatus in the storage media. The program code read out from the storage media realizes the functions of the previously mentioned embodiments, and the present invention is embodied in the program code and the storage media storing the code. The storage media for supplying the program code includes, for example, a floppy (R) disc, a CD-ROM, a DVD-ROM, a hard disk, an optical disc, an optical magnetic disc, a CD-R, a magnetic tape, a non-volatile memory card, a ROM and the like.

An OS (operating system), for example, running on the computer can perform part or whole of actual processing based on indications by the program code, such that the previously mentioned functions of the embodiments can be realized by the processing. The CPU in the computer can also perform part or whole of actual processing based on indication by the program code after the program code read out from the storage media is written into a memory on the computer, such that the previously mentioned functions of the embodiments can be realized by the processing.

The functions can be also achieved such that the software program code for realizing the functions of the embodiments is distributed via a network, stored in storage means such as the hard disk or the memory in the system or the apparatus or storage media such as a CD-RW or a CD-R, and executed after the program code is read out that is stored in the relevant storage means or the relevant storage media by the computer (or CPU, MPU) for the system or the apparatus.

What is claimed is:

1. A review apparatus for reviewing a sample by moving a sample stage onto pre-calculated coordinates, comprising:
   a central control unit; and
   a plurality of coordinate correction tables for correcting a deviation between coordinate values of the coordinates and a sample position in the review apparatus;
   wherein the central control unit evaluates correction accuracy of the plurality of coordinate correction tables, then switches to one of the plurality of coordinate correction tables based on a result of the evaluation, and corrects the coordinate values using the switched coordinate correction table, and
   wherein the central control unit evaluates correction accuracy of the plurality of coordinate correction tables by calculating the deviation between the coordinate value corrected by each of the coordinate correction tables and a coordinate value detected by the review apparatus.

2. The review apparatus according to claim 1, further comprising a display for displaying a combination of some of a tendency of a deviation, an ID of the inspection apparatus, a condition to calculate the coordinate values, required magnification for the sample to be in a field of view, and a required field of view for the sample to be in the field of view.

3. A review apparatus for reviewing a sample by moving a sample stage onto pre-calculated coordinates, comprising:
   a central control unit; and
   a plurality of coordinate correction tables for correcting a deviation between coordinate values of the coordinates and a sample position in the review apparatus;
   wherein the central control unit evaluates correction accuracy of the plurality of coordinate correction tables, then switches to one of the plurality of coordinate correction tables based on a result of the evaluation, and corrects the coordinate values using the switched coordinate correction table, and
   wherein the central control unit calculates deviations between coordinate values in which plurality of points are corrected according to the coordinate correction tables and a plurality of coordinate values detected by the review apparatus and evaluates correction accuracy of the plurality of coordinate correction tables by weighting the obtained deviation amount if there are the plurality of pre-calculated coordinates.

4. A review apparatus for reviewing a sample by moving a sample stage onto pre-calculated coordinates, comprising:
   a central control unit; and
   a plurality of coordinate correction tables for correcting a deviation between coordinate values of the coordinates and a sample position in the review apparatus;
   wherein the central control unit evaluates correction accuracy of the plurality of coordinate correction tables, then switches to one of the plurality of coordinate correction tables based on a result of the evaluation, and corrects the coordinate values using the switched coordinate correction table, and
   wherein the central control unit sets a coordinate correction table whose evaluation result of the correction accuracy is determined to be best among the plurality of coordinate correction tables, as an initial correction table for a next-time review.

5. A review apparatus for reviewing a sample by moving a sample stage onto coordinates of a defect that has been calculated by an inspection apparatus, comprising:
   a central control unit; and
   a plurality of coordinate correction tables for correcting a deviation between a coordinate value of the defect that is calculated by the inspection apparatus and a coordinate value of the defect detected by the review apparatus,
   wherein the central control unit evaluates correction accuracy of the plurality of coordinate correction tables by calculating deviations between corrected coordinate values corrected according to the tables and coordinate values of the defects detected by the review apparatus,
   selects either one of the plurality of coordinate correction tables for each of the defects based on a result of the evaluation,
   corrects the coordinate value detected by the inspection apparatus using the selected coordinate correction table.

6. A review apparatus for reviewing a sample by moving a sample stage onto coordinates of defect positions on the sample that have been calculated by an inspection apparatus, comprising:

a central control unit; and a plurality of coordinate correction tables provided in correspondence to a combination of the inspection apparatus that calculated coordinate values and the calculation condition of the coordinate values, wherein the central control unit identifies the combination of the inspection apparatus and the calculation condition of the coordinate values with respect to coordinate values of defect positions to be observed, selects a coordinate correction table corresponding to the identified combination from among the plurality of coordinate tables, and corrects the coordinates of the defect positions using the selected coordinate correction table, and wherein the central control unit selects a coordinate correction table containing either one of the inspection apparatus and the calculation condition if no coordinate correction table contains the combination.

7. The review apparatus according to claim 1, further comprising a display for displaying a combination of some of a tendency of a deviation, an ID of the inspection apparatus, a condition to calculate the coordinate values, required magnification for the sample to be in a field of view, and a required field of view for the sample to be in the field of view.

8. The review apparatus according to claim 7, wherein the central control unit further notifies the inspection apparatus for calculating the coordinate values, or a system for managing the inspection apparatus for calculating the coordinate values of the tendency of the deviation if the tendency of the deviation changes over a set reference value.

* * * * *